US007310758B1

(12) United States Patent
Cossoul et al.

(10) Patent No.: US 7,310,758 B1
(45) Date of Patent: Dec. 18, 2007

(54) CIRCUIT FOR AND METHOD OF IMPLEMENTING PROGRAMMABLE LOGIC DEVICES

(75) Inventors: Matthieu P. H. Cossoul, Sunnyvale, CA (US); Shekhar Bapat, Cupertino, CA (US)

(73) Assignee: Xilinx, Inc., San Jose, CA (US)

( * ) Notice: Subject to any disclaimer, the term of this patent is extended or adjusted under 35 U.S.C. 154(b) by 238 days.

(21) Appl. No.: 11/208,574

(22) Filed: Aug. 22, 2005

(51) Int. Cl.
*G01R 31/28* (2006.01)

(52) U.S. Cl. .......................... 714/725; 714/742; 714/3; 714/8; 714/25; 716/16; 326/39

(58) Field of Classification Search ..................... None
See application file for complete search history.

(56) References Cited

U.S. PATENT DOCUMENTS

| 5,424,589 | A | * | 6/1995 | Dobbelaere et al. | 326/41 |
| 5,430,734 | A | * | 7/1995 | Gilson | 714/725 |
| 5,581,562 | A | * | 12/1996 | Lin et al. | 714/724 |
| 5,790,771 | A | * | 8/1998 | Culbertson et al. | 714/3 |
| 6,072,234 | A | * | 6/2000 | Camien et al. | 257/686 |
| 6,570,404 | B1 | * | 5/2003 | Norman et al. | 326/39 |
| 6,664,808 | B2 | * | 12/2003 | Ling et al. | 326/41 |
| 6,817,006 | B1 | | 11/2004 | Wells et al. | |
| 6,882,176 | B1 | * | 4/2005 | Norman et al. | 326/39 |
| 6,891,395 | B2 | | 5/2005 | Wells et al. | |
| 6,991,947 | B1 | * | 1/2006 | Gheewala | 438/15 |
| 7,058,534 | B1 | * | 6/2006 | Tracy et al. | 702/117 |
| 7,082,591 | B2 | * | 7/2006 | Carlson | 716/16 |

OTHER PUBLICATIONS

Dehkordi et al., "Performance Comparison of MCM-D and SMT Packaging Technologies for a DSP Subsystem", IEEE, International Symposium on Circuits and Systems, vol. 4, May 12-15, 1996, pp. 245-248.*
Doumar et al., "Defect and Fault Tolerance FPGAs by Shifting the Configuration Data", International Symposium on DFT in VLSI Systems, Nov. 1-3, 1999, pp. 377-385.*
U.S. Appl. No. 10/388,000, filed Mar. 12, 2003, Bapat et al.
U.S. Appl. No. 10/624,832, filed Jul. 21, 2003, Young.
U.S. Appl. No. 10/631,461, filed Jul. 30, 2003, Wells et al.
U.S. Appl. No. 10/815,483, filed Apr. 1, 2004, Trimberger et al.

* cited by examiner

*Primary Examiner*—John P Trimmings
(74) *Attorney, Agent, or Firm*—John J. King

(57) ABSTRACT

A method of employing a plurality of integrated circuits in a multi-chip module is described. The method comprises steps of identifying a defective programmable logic device implemented on a first die; identifying a functional programmable logic device implemented on a second die; and coupling the defective programmable logic device and the functional programmable logic device. According to an alternate embodiment, a method of employing a plurality of integrated circuits in a multi-chip module comprises steps of configuring a plurality of programmable logic devices on a multi-chip module. A multi-chip integrated circuit package is also described.

16 Claims, 4 Drawing Sheets

--Prior Art--

CIRCUIT FOR AND METHOD OF IMPLEMENTING PROGRAMMABLE LOGIC DEVICES

FIELD OF THE INVENTION

The present invention relates generally to multi-chip modules, and in particular, to a method of and circuit for implementing a plurality of programmable logic devices in a multi-chip module.

BACKGROUND OF THE INVENTION

A programmable logic device, such as a complex programmable logic device (CPLD) or a field programmable gate array (FPGA) is designed to be user-programmable so that users can implement logic designs of their choices. In a typical FPGA, an array of configurable logic blocks (CLBs) are coupled to programmable input/output blocks (IOBs). The CLBs and IOBs are interconnected by a hierarchy of programmable routing resources. These CLBs, IOBs, and programmable routing resources are customized by loading a configuration bitstream into configuration memory cells of the FPGA. As circuit designs implemented in an FPGA are becoming more complex, the number of CLBs, IOBs, and/or other resources (e.g., multipliers and block RAMs) has increased, as well as the routing resources to make the connections between the various blocks. As a result, the size of FPGA die and the resources fabricated on the die has grown. Because the number of defects is proportional to the area of a die, the probability of having a defect in a die has also increased.

The circuits implemented by different customers using FPGAs are generally unique. In some cases, customer designs may require more than one FPGA. Further, a circuit design may undergo modifications during product development phase. Thus, multiple versions of a circuit may be implemented on an FPGA. If an FPGA contains a single defect (e.g., one of its configuration memory cells is defective), it may render an end product unusable because the design may need to use that defective resource. Accordingly, the problem of low yield has significant economic impact on FPGA manufacturers.

While a gross defect causes failure of an entire FPGA, a localized defect causes failure of small circuitry in the FPGA. In order to avoid problems with customers, an FPGA manufacturer needs to discard an FPGA even if it contains only one defect. It has been found that a majority of large FPGA dies are discarded because of localized defects. Methods have been found to use some of these defective dies, thereby reducing the cost of product of the FPGA manufacturer. In particular, it may be determined that a defect in a given FPGA die will not affect the customer's design, making that given defective die suitable for the customer. For example, a user may program a predetermined circuit design. If the design works, the die would be acceptable to the customer. As a result, customers can take advantage of lower priced FPGAs for specific design patterns. However, some applications of programmable logic devices require that configurable logic blocks of the programmable logic device be reprogrammed. Defective die are typically not suitable for such applications because a defective die which may have been suitable for a predetermined design may not be suitable for a revised design.

Accordingly, there is a need for an improved circuit for and method of implementing defective programmable logic devices.

SUMMARY OF THE INVENTION

A method of employing a plurality of integrated circuits in a multi-chip module is described. The method comprises steps of identifying a defective programmable logic device implemented on a first die; identifying a functional programmable logic device implemented on a second die; and coupling the defective programmable logic device and the functional programmable logic device in a multi-chip module.

According to an alternate embodiment, a method of employing a plurality of integrated circuits in a multi-chip module comprises steps of configuring a functional programmable logic device implemented on a first die with a first predetermined circuit; determining whether a defective programmable logic device implemented on a second die can enable a second predetermined circuit; configuring the defective programmable logic device with the second predetermined circuit; and coupling the functional programmable logic device to the defective programmable logic device.

A multi-chip integrated circuit package is also described. The multi-chip integrated circuit package comprises a first programmable logic device identified as functional; a second programmable logic device identified as defective; and a coupling element having a plurality of conductors coupling the first programmable logic device and the second programmable logic device.

DETAILED DESCRIPTION OF THE DRAWINGS

Figure 1:
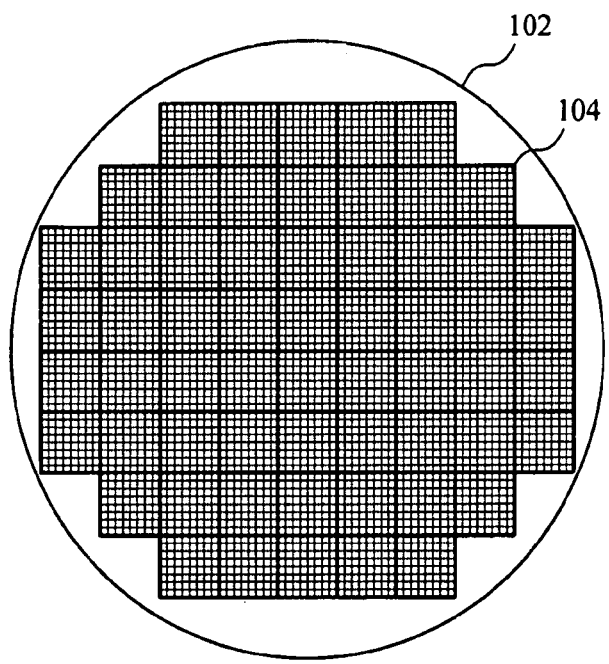
FIG. 1 is a plan view of a wafer having a plurality of die according to an embodiment the present invention.

The various embodiments of the methods of implementing programmable logic devices described below increase the yield of programmable logic devices by enabling the use of defective programmable logic devices that might otherwise be scrapped. As will be described, defective programmable logic devices are selectively used in a multi-chip module application in circumstances where the defective programmable logic device is used to implement fixed portions of a given circuit design, while a functional programmable logic device is used to implement a reprogrammable portion of the circuit design. In order to implement the methods described below, various die of a wafer must be analyzed to determine whether the die is defective. A plan view of a wafer 102 having a plurality of die 104 according to an embodiment the present invention is shown in FIG. 1.

Although the wafer of FIG. 1 has a given size die, a plurality of wafers having different size die are used according to some embodiments, as will be described in detail below. The die must be tested to determine whether any of the die is defective. A programmable logic device which is not determined to be defective is therefore considered to be a functional device which has passed predetermined test criteria. However, passing the predetermined test criteria does not necessarily mean that the device is not defective in other ways or has some defects. Rather, a device is considered functional if it meets predetermined criteria. These criteria could vary between manufacturers or users of the programmable logic devices. In contrast, a defective die could be a die which has enough defects or certain defects which would not allow the use of the die for general purposes, but which could be used for specific applications, as will be described below.

Figure 2:
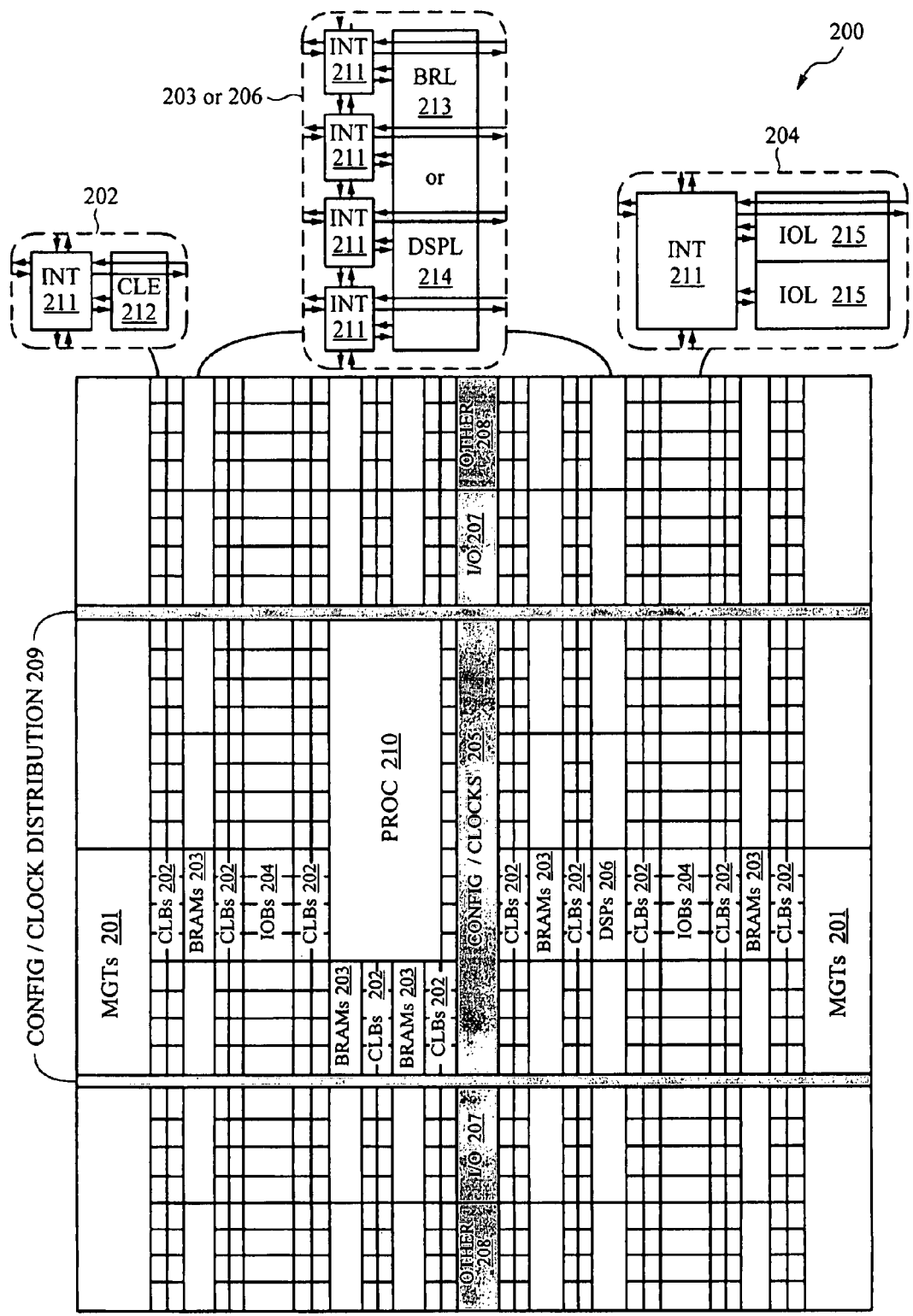
FIG. 2 is a block diagram of a programmable logic device according to an embodiment of the present invention.

Turning now to FIG. 2, a block diagram of a programmable logic device according to an embodiment of the present invention is shown. In particular, advanced FPGAs can include several different types of programmable logic blocks in the array. For example, FIG. 2 illustrates an FPGA architecture 200 that includes a large number of different programmable tiles including multi-gigabit transceivers (MGTs 201), configurable logic blocks (CLBs 202), random access memory blocks (BRAMs 203), input/output blocks (IOBs 204), configuration and clocking logic (CONFIG/CLOCKS 205), digital signal processing blocks (DSPs 206), specialized input/output blocks (I/O 207) (e.g., configuration ports and clock ports), and other programmable logic 208 such as digital clock managers, analog-to-digital converters, system monitoring logic, and so forth. Some FPGAs also include dedicated processor blocks (PROC 210).

In some FPGAs, each programmable tile includes a programmable interconnect element (INT 211) having standardized connections to and from a corresponding interconnect element in each adjacent tile. Therefore, the programmable interconnect elements taken together implement the programmable interconnect structure for the illustrated FPGA. The programmable interconnect element (INT 211) also includes the connections to and from the programmable logic element within the same tile, as shown by the examples included at the top of FIG. 2.

For example, a CLB 202 can include a configurable logic element (CLE 212) that can be programmed to implement user logic plus a single programmable interconnect element (INT 211). A BRAM 203 can include a BRAM logic element (BRL 213) in addition to one or more programmable interconnect elements. Typically, the number of interconnect elements included in a tile depends on the height of the tile. In the pictured embodiment, a BRAM tile has the same height as four CLBs, but other numbers (e.g., five) can also be used. A DSP tile 206 can include a DSP logic element (DSPL 214) in addition to an appropriate number of programmable interconnect elements. An IOB 204 can include, for example, two instances of an input/output logic element (IOL 215) in addition to one instance of the programmable interconnect element (INT 211). As will be clear to those of skill in the art, the actual I/O pads connected, for example, to the I/O logic element 215 are manufactured using metal layered above the various illustrated logic blocks, and typically are not confined to the area of the input/output logic element 215.

In the pictured embodiment, a columnar area near the center of the die (shown shaded in FIG. 2) is used for configuration, clock, and other control logic. Horizontal areas 209 extending from this column are used to distribute the clocks and configuration signals across the breadth of the FPGA. Some FPGAs utilizing the architecture illustrated in FIG. 2 include additional logic blocks that disrupt the regular columnar structure making up a large part of the FPGA. The additional logic blocks can be programmable blocks and/or dedicated logic. For example, the processor block PROC 210 shown in FIG. 2 spans several columns of CLBs and BRAMs.

Note that FIG. 2 is intended to illustrate only an exemplary FPGA architecture. The numbers of logic blocks in a column, the relative widths of the columns, the number and order of columns, the types of logic blocks included in the columns, the relative sizes of the logic blocks, and the interconnect/logic implementations included at the top of FIG. 2 are purely exemplary. For example, in an actual FPGA more than one adjacent column of CLBs is typically included wherever the CLBs appear, to facilitate the efficient implementation of user logic. Similarly the circuits and methods of the present invention could be implemented in any device, including any type of programmable logic device, having memory.

Figure 3:
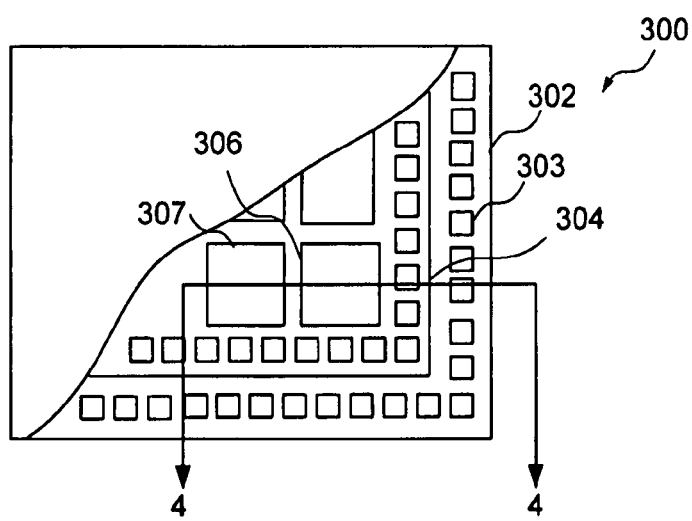
FIG. 3 is a plan view of an integrated circuit package having a plurality of programmable logic devices according to an embodiment of the present invention.
Figure 4:
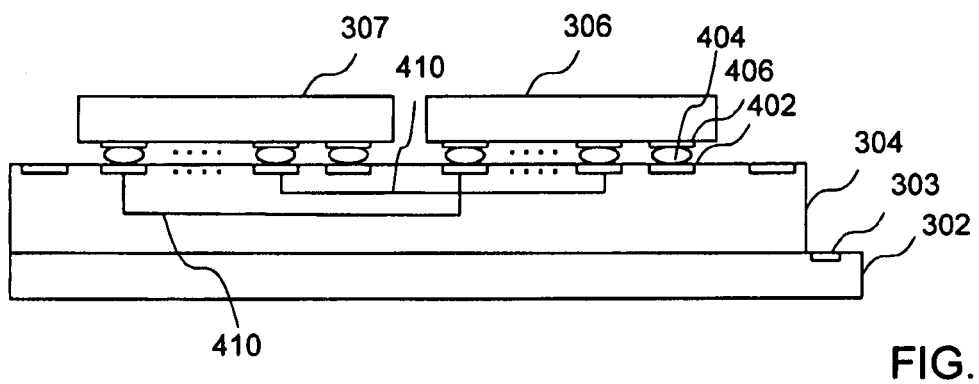
FIG. 4 is a cross sectional view of the integrated circuit package of FIG. 3.

Turning now to FIGS. 3 and 4, a multi-chip module according to an embodiment of the present invention is shown. Multi-chip module (MCM) technology allows the integration of multiple integrated circuits (IC) chips in a single package. In particular, a multi-chip module 300 comprises a substrate 302 having a plurality of wire bond pads 303. A carrier wafer 304 is coupled to the multi-chip module 300, as is shown in more detail in reference to the cross-section of FIG. 4. A plurality of chips 306 and 307, in this case flip chips, is positioned on the carrier wafer 304. The carrier wafer 304 could be for example, a silicon carrier wafer, or some other suitable material. The substrate 302 could be a ceramic substrate, or some other organic or inorganic substrate. As shown in FIG. 4, bump pads 402 on the carrier wafer enable coupling the flip chips 306 to the substrate 302. Solder bumps 404 enable a connection to contact pads 406. Finally, lines 410 generally enable the coupling of the two or more chips, and in particular, the coupling of regions of the chips employing programmable logic. Such coupling of programmable logic in flip chips is described in more detail in U.S. application Ser. No. 10/624,832 Entitled "A Programmable Multi-Chip Module," filed on Jul. 21, 2003 and assigned to the assignee of the present invention, the entire application of which is incorporated herein by reference.

Customers of programmable logic devices often find it difficult to freeze an entire design. Accordingly, customers want a portion of their device to remain reprogrammable. By incorporating both a defective programmable logic device die with fully functional programmable logic device die, a customer can receive a multi-chip module at a significantly reduced price. That is, because the die having the defective programmable logic device would otherwise be discarded, the multi-chip module can be provided to a customer at a reduced cost. As will be described in detail below, the multi-chip module could have any combination of functional and defective die. That is, the multi-chip module could comprise one or more of each of the two categories of die (i.e. functional or defective) where 306 represents a functional die and 307 represents a defective die.

Further, multiple wafers are tested, and die for a given multi-chip module could come from different wafers depending on the circuit design and the requirements for fixed and reprogrammable circuits of the circuit design. By selecting die sizes which are appropriate for the portions of the circuits to be implemented on defective and functional die of a given multi-chip module, the cost of producing the multi-chip modules can be further optimized. That is, by using a die of a defective wafer having a smaller size when less circuitry is required to implement a given portion of the circuit design, the defective wafer can be more efficiently used. Programmable logic devices having certain functionality on defective die can be selected such that the dedicated functionality in each defective die would speed creation of new chips by enabling the selection of existing implementations. That is, a customizable hard intellectual property (IP) platform could be provided where specialized circuits are implemented in a plurality of defective die, and a programmable die is used to interconnect them in an upgradeable way. However, it is necessary to determine both whether the die having the programmable logic device is defective, and whether the die can be used for a portion of a predetermined design.

Figure 5:
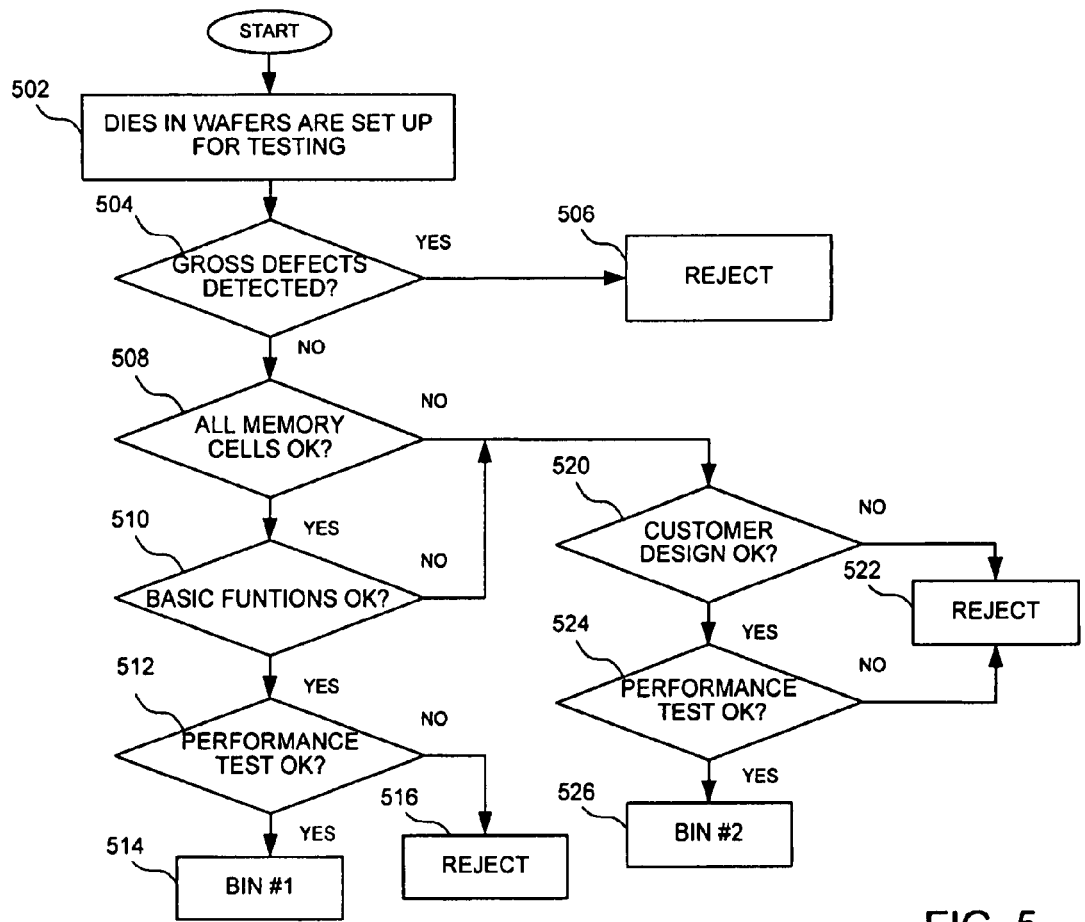
FIG. 5 is a flow chart showing a method of testing dies of a wafer according to an embodiment of the present invention.

Turning now to FIG. 5, a flow chart shows a method of testing dies of a wafer according to an embodiment of the present invention. Wafers are set up for testing at a step 502, where the wafers are selected based upon the chips needed for the multi-chip module. Gross defects are tested at a step 504. This is typically a DC type of testing. Examples of gross defects are opens, shorts, and excessive leakage currents. If gross defects are found, the die is rejected at a step 506. If there are no gross defects, a test for localized defects follows. The memory cells are first tested at a step 508. This test can be performed by writing data to the cells and reading the data back. For example, if there are fewer than 10 defects, the memory cells would be considered to pass the test. If the memory cells pass the test for localized defects, the basic functions of the FPGA are tested at a step 510. If there is no localized defect in the basic functions, performance testing is performed at a step 512. An example of a performance test is speed performance testing. It is known that different integrated circuits from different fab lots or wafers may have different speed performance due to process variation. In order to make sure that an FPGA meets its manufacturer's speed performance specification, the FPGA can be configured to have different paths and then measure the time delay of a signal traveling through each path. Usually, the FPGA that has less delay can handle circuits that need high speed performance. If the performance testing is passed, the FPGA is not defective, and is placed in a designated bin at a step 514. If performance testing indicates that the FPGA does not meet the minimum performance specification, the FPGA is rejected at a step 516.

Previously, FPGAs containing localized defects in memory cells identified at step 508 or basic functions identified at step 510 were discarded. However, according to one aspect of the present method, the FPGA is further tested to determine if it may be used to implement a specific customer design at a step 520. In performing this step, the customer's design is loaded into the FPGA and the FPGA is configured. The FPGA is tested to make sure that the design works within specification. If the test reveals that the design is adversely affected by the localized defects in the FPGA, the FPGA is rejected at a step 522. If the FPGA passes the test, a performance test is performed at a step 524. If the FPGA fails to meet the minimum performance specification, it is rejected. If it passes performance testing, the FPGA is placed in specially designated bin at a step 526. The FPGAs in this bin can only be used to implement this specific customer design.

The above described procedure is possible because many customer designs only use a portion of the total FPGA available resources. For example, an FPGA contains many interconnect lines to allow users flexibility in designing their circuits. Many of these interconnect lines are not used in a specific design. Thus, if an FPGA contains only a few localized defects, it is likely that many designs do not encounter these localized defects. As a result, the FPGA is usable for that particular design, and there is no need to discard the FPGA. Additional details related to testing die can be found in U.S. Pat. No. 6,664,808, the entire patent of which is incorporated herein by reference. While U.S. Pat. No. 6,664,808 describes one method for determining whether a programmable logic device implemented on a die is defective, other criteria could be used for determining whether the programmable logic device is defective.

Figure 6:
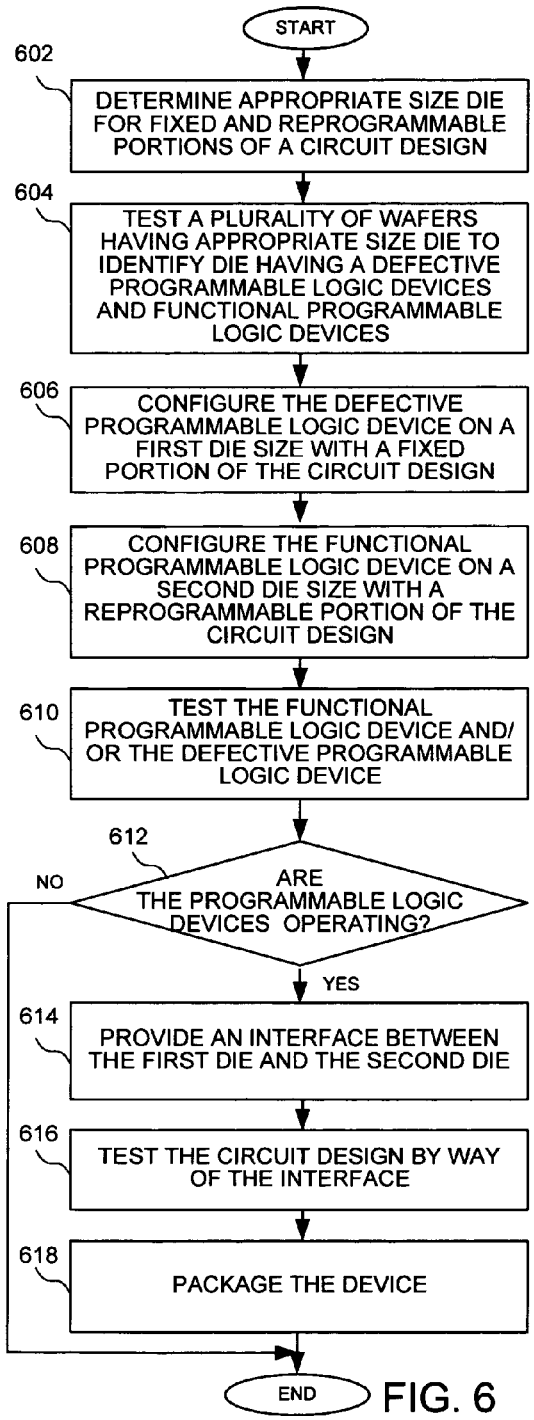
FIG. 6 is a flow chart showing a method of employing a plurality of integrated circuits in a multi-chip module according to an embodiment of the present invention.

Turning now to FIG. 6, a flow chart shows a method of employing a plurality of programmable logic devices in a multi-chip module according to an embodiment of the present invention. Appropriate sized die for fixed and reprogrammable portions of a circuit are determined at a step 602. That is, the amount of circuitry required for fixed circuits and the amount of circuitry required for reprogrammable circuits for a given circuit design will often vary. Selecting appropriate sized die for the different circuits will further optimize the cost of producing multi-chip modules. A plurality of die on the wafers is tested to identify die having defective programmable logic devices and functional programmable logic devices at a step 604. The defective programmable logic device, which could be on a first sized die, is configured with a fixed portion of the circuit design at a step 606. That is, the defective die is programmed with a portion of a circuit design which will not change, e.g., the circuit design is initially configured in the PLD (and except for a restart), is not, or very infrequently, reconfigured. The functional programmable logic device is configured with a reprogrammable portion of the circuit design at a step 608. The functional programmable logic device could be on a second size die which could be different than the first size die. The defective programmable logic device and the functional programmable logic device are then tested to pass the customer design at a step 610. It is then determined whether the programmable logic devices are operating properly at a step 612. An interface is then provided between the first die and the second die at a step 614. The defective programmable logic device and the functional programmable logic device are coupled by way of the interface. The circuit design is tested by way of the interface at a step 616. Finally, the device is packaged at a step 618 to generate a completed multi-chip module.

Figure 7:
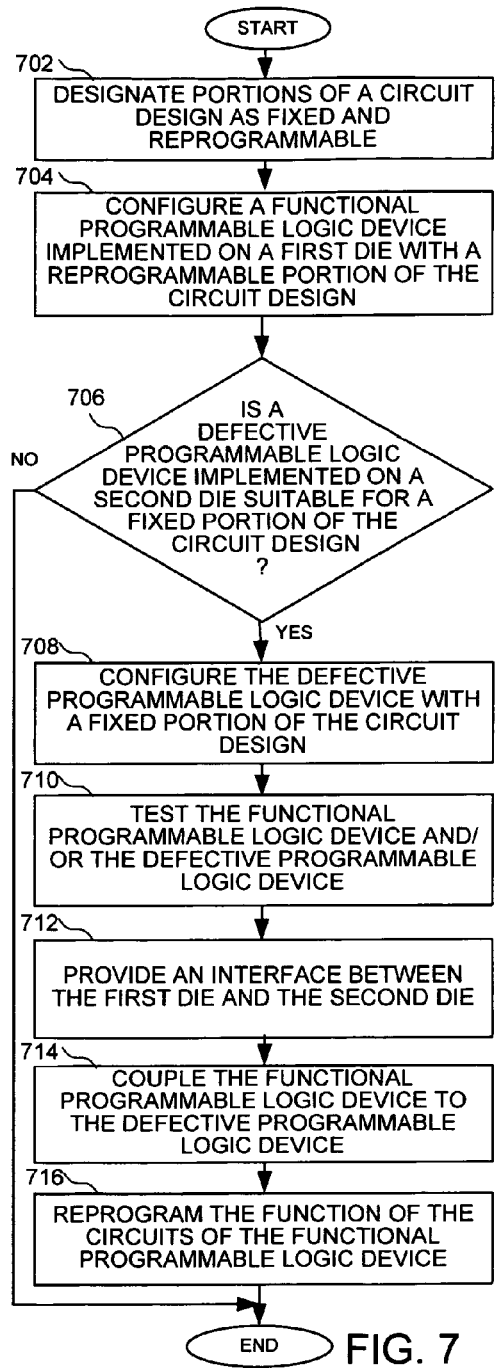
FIG. 7 is a flow chart showing a method of employing a plurality of integrated circuits in a multi-chip module according to an alternate embodiment the present invention.

Turning now to FIG. 7, a flow chart shows a method of employing a plurality of integrated circuits in a multi-chip module according to an alternate embodiment the present invention. Portions of a circuit design are designated as fixed and reprogrammable at a step 702. A functional programmable logic device implemented on a first die is configured with a reprogrammable portion of the circuit design at a step 704. It is then determined whether a defective programmable logic device implemented on a second die is suitable for a fixed portion of the circuit design at a step 706. The defective programmable logic device is configured with a fixed portion of the circuit design at a step 708, where the fixed portion is infrequently reconfigured relative to the reprogrammable portion. The defective programmable logic device and the functional programmable logic device are then tested to pass the customer design at a step 710. An interface is provided between the first die and the second die at a step 712. The functional programmable logic device is coupled to the defective programmable logic device at a step 714. Finally, the functions of the circuits of the functional programmable logic device are reprogrammed at a step 716.

It can therefore be appreciated that the new and novel method of implementing a plurality of programmable logic devices has been described. It will be appreciated by those skilled in the art that numerous alternatives and equivalents will be seen to exist which incorporate the disclosed invention. As a result, the invention is not to be limited by the foregoing embodiments, but only by the following claims.

The invention claimed is:

1. A method of employing a plurality of integrated circuits in a multi-chip module, said method comprising the steps of:
   identifying a defective programmable logic device implemented on a first die;
   selecting said first die to be implemented on said multi-chip module after identifying said defective programmable logic device;
   identifying a functional programmable logic device implemented on a second die;
   selecting said second die to be implemented on said multi-chip module after identifying said functional programmable logic device; and
   coupling said defective programmable logic device and said functional programmable logic device.

2. The method of claim 1 further comprising a step of configuring said functional programmable logic device implemented on said second die with a first predetermined circuit.

3. The method of claim 2 wherein said step of configuring said functional programmable logic device implemented on said second die with a first predetermined circuit comprises a step of configuring said functional programmable logic device with a reprogrammable portion of a predetermined circuit design.

4. The method of claim 3 further comprising a step of configuring said defective programmable logic device with a second predetermined circuit.

5. The method of claim 4 wherein said step of configuring said defective programmable logic device with a second predetermined circuit further comprises a step of configuring said defective programmable logic device with a fixed portion of said predetermined circuit design, said fixed portion being infrequently reconfigured relative to said reprogrammable portion.

6. The method of claim 1 further comprising a step of providing an interface between said first die and said second die.

7. The method of claim 6 further comprising a step of testing said circuit design by way of said interface.

8. A method of employing a plurality of integrated circuits in a multi-chip module, said method comprising the steps of:
   identifying a reprogrammable portion of a circuit design;
   configuring a functional programmable logic device implemented on a first die with a first predetermined circuit comprising said reprogrammable portion of said circuit design;
   identifying a fixed portion of said circuit design
   determining whether a defective programmable logic device implemented on a second die is suitable for a second predetermined circuit comprising said fixed portion of said circuit design;
   configuring said defective programmable logic device with said second predetermined circuit; and
   coupling said functional programmable logic device to said defective programmable logic device.

9. The method of claim 8 further comprising a step of determining if said second die is defective.

10. The method of claim 8 further comprising a step of selecting a die size for said first die and said second die.

11. The method of claim 8 further comprising a step of designating portions of said circuit design as fixed and reprogrammable.

12. The method of claim 8 further comprising a step of reprogramming said first predetermined circuit of said functional programmable logic device.

13. A multi-chip integrated circuit package comprising:
   a first programmable logic device identified as functional, said first programmable logic device being configured with a reprogrammable portion of a circuit design;
   a second programmable logic device identified as defective, said second programmable logic device being configured with a fixed portion of said circuit design; and
   a coupling element having a plurality of conductors coupling said first programmable logic device and said second programmable logic device.

14. The multi-chip integrated circuit package of claim 13 wherein said coupling element comprises a carrier wafer coupled to receive said first programmable logic device and said second programmable logic device.

15. The multi-chip integrated circuit package of claim 14 wherein said coupling element further comprises a substrate coupled to receive said carrier wafer.

16. The multi-chip integrated circuit package of claim 13 wherein said first programmable logic device and said second programmable logic device comprise field programmable gate arrays.

* * * * *